US007186120B2

(12) United States Patent
Saka

(10) Patent No.: US 7,186,120 B2
(45) Date of Patent: Mar. 6, 2007

(54) AUTOMOTIVE RELAY AND ELECTRICAL CONNECTOR BOX

(75) Inventor: Yuuji Saka, Yokkaichi (JP)

(73) Assignee: Sumitomo Wiring Systems, Ltd., Yakkaichi (JP)

( * ) Notice: Subject to any disclaimer, the term of this patent is extended or adjusted under 35 U.S.C. 154(b) by 0 days.

(21) Appl. No.: 11/092,853

(22) Filed: Mar. 30, 2005

(65) Prior Publication Data

US 2005/0221642 A1 Oct. 6, 2005

(30) Foreign Application Priority Data

Apr. 6, 2004 (JP) ............................ 2004-112464

(51) Int. Cl.
*H01R 12/00* (2006.01)
*H05K 1/00* (2006.01)

(52) U.S. Cl. ........................ 439/76.2; 439/949; 335/83

(58) Field of Classification Search ............... 439/76.2, 439/949; 335/78, 89, 128
See application file for complete search history.

(56) References Cited

U.S. PATENT DOCUMENTS

| | | | | |
|---|---|---|---|---|
| 4,745,382 | A * | 5/1988 | Dittmann | 335/128 |
| 4,801,908 | A * | 1/1989 | Weaver | 335/80 |
| 5,748,061 | A * | 5/1998 | Tsutsui et al. | 335/83 |
| 5,903,200 | A * | 5/1999 | Ogawa et al. | 335/78 |
| 6,057,749 | A * | 5/2000 | Doneghue | 335/83 |
| 6,220,875 | B1 | 4/2001 | Kawakita | 439/76.2 |
| 6,244,877 | B1 * | 6/2001 | Asao | 439/76.2 |
| 6,270,360 | B1 * | 8/2001 | Yanase | 439/76.2 |
| 6,402,530 | B1 * | 6/2002 | Saito et al. | 439/76.2 |
| 6,515,226 | B2 * | 2/2003 | Chiriku et al. | 174/50 |
| 6,560,115 | B1 * | 5/2003 | Wakabayashi et al. | 361/728 |
| 6,614,203 | B2 * | 9/2003 | Yuasa et al. | 320/104 |
| 6,670,548 | B2 | 12/2003 | Sumida et al. | 174/50 |
| 6,677,521 | B2 | 1/2004 | Sumida et al. | 174/50 |

FOREIGN PATENT DOCUMENTS

| | | |
|---|---|---|
| JP | 2000-092660 | 3/2000 |
| JP | 2000-285988 | 10/2000 |
| JP | 2002-027634 | 1/2002 |
| JP | 2002-84630 | 3/2002 |

OTHER PUBLICATIONS

U.S. Appl. No. 11/092,710, Yuuji Saka, filed Mar. 30, 2005.
U.S. Appl. No. 11/092,726, Yuuji Saka, filed Mar. 30, 2005.
U.S. Appl. No. 11/000,189, Yuuji Saka, filed Dec. 1, 2004.
English Language Abstract of 2000-92660.
English Language Abstract of 2002-27634.
English Language Abstract of 2000-285988.
English Language Abstract of 2002-84630.

* cited by examiner

*Primary Examiner*—Hae Moon Hyeon
(74) *Attorney, Agent, or Firm*—Greenblum & Bernstein, P.L.C.

(57) ABSTRACT

An automotive relay and electrical connector box in which relays provided in the connector box do not include an integrated resistor, but provide for the attachment of a resistor only when a relay is connected to a circuit requiring resistance. When a common relay which does not include an internal resistor parallel-wired to the coil therein requires the connection of a resistor, both leads of a lead-type resistor are welded to terminals that project from the relay body.

22 Claims, 14 Drawing Sheets

( A )

( B )

( C )

AUTOMOTIVE RELAY AND ELECTRICAL CONNECTOR BOX

CROSS REFERENCE TO RELATED APPLICATIONS

The present disclosure relates to subject matter contained in priority Japanese Application No. 2004-112464, filed on Apr. 6, 2004,which is herein expressly incorporated by reference in its entirety.

BACKGROUND OF THE INVENTION

1. Field of the Invention

The present invention relates to an automotive relay and an automotive electrical connector box equipped with the relay, and more particularly, to an improved relay structure used in an automotive electrical circuit within the electrical connector box.

2. Description of Background Information

A prior art automotive electrical connector box is typically equipped with a plurality of relays. For example, Japanese Kokai Patent Publication No. 2000-92660 describes an automotive electrical connector box structure which, as illustrated in FIG. 12, includes horizontal bus bars 5A through 5D alternately located between respective insulator boards 4A through 4D in a stacked configuration, and tabs 5*a* that bend from bus bars 5A–5D at required locations, project externally toward upper case 2 and lower case 3, and enter connector receptacle 6, relay receptacle 7, and fuse receptacle 8. Electrical connector box 1 utilizes plug-in type relays that are inserted into relay receptacle 7 which is provided on an external surface of the case.

Furthermore, Japanese Kokai Patent Publication No. 2002-27634 describes electrical connector box 100 that, as shown in FIG. 13, includes multiple relays 101 fixedly mounted to baseboard 102 with the terminals of relays 101 connected to the conductors of the internal circuit within the case part.

The automotive relay, which is particular to an automotive application, is constructed in the form of relay 105 shown in FIG. 14. Relay 105 includes contact points 106 that connect to a power circuit, relay coil 107 that connects to a control circuit, and resistor 108 which is wired in parallel with coil 107 in order to suppress counter-voltage.

A circuit that requires resistor 108 to be wired to relay 105 is subjected to large voltage fluctuations when switched on and off, and is the type of circuit subjected to loads induced by mechanisms such as power windows, door locks, and windshield wipers. Circuits not subjected to large voltage fluctuations, for example, circuits connected to lamps and the like, do not require the use of resistor 108. Despite the fact that an automobile has many circuits which do not require that relay 105 be equipped with resistor 108, relays equipped with resistor 108 are nevertheless used throughout the vehicle, thus resulting in the use of unnecessarily large relays and connector boxes made to unnecessarily large size.

Particularly in applications where the electrical connector box is placed within the instrument panel in front of the front seat at a position opposing the passenger's knees, it is preferable that space be provided between the electrical connector box and front wall of the instrument panel in order to improve passenger safety. That is, it is preferable that a sufficient crush space be provided to allow the instrument panel to bend inward in order to reduce the shock of collision should a quick stop result in a passenger striking the instrument panel. The space within the instrument panel is limited, however, thus resulting in an inability to provide sufficient crush space if the panel houses a large electrical connector box. Therefore, there is a need to make the electrical connector box to thinner cross section.

SUMMARY OF THE INVENTION

In consideration of the shortcomings in the prior art, the present invention provides a compact electrical connector box of thin cross section and a compact automotive relay constructed for use therein.

The present invention resolves the shortcomings of the prior art through an automotive relay of the type installed in an automotive electrical circuit, the relay not including a resistor circuit parallel-wired to the coil therein, but allowing connection of both leads of a lead-type resistor to terminals projecting from the body of the relay body when the relay is to be connected to a circuit requiring a resistor.

This construction allows the use of relays not incorporating an internal resistor circuit, but provides for the attachment of a lead-type resistor to the terminals of a relay to be connected to a circuit requiring a resistor, therefore allowing the relay to be made smaller and at reduced expense compared to a relay of the type that incorporates an internal resistor circuit.

The automotive relay may be located within the electrical connector box and connected to the internal circuit therein, or connected to the internal circuit of the electrical box through attachment to a relay receptacle provided on the exterior of the electrical connector box case.

The automotive relay may be located within the electrical connector box and connected to the internal circuit therein in the same manner as a conventional relay equipped with an internal resistor circuit, or may be connected to the internal circuit through installation to a relay receptacle located on an exterior portion of the electrical connector box case. Therefore the relay may be installed in the electrical connector box in the same manner as a conventional relay.

The construction of the present invention allows the use of relays not incorporating an internal resistor circuit, but provides for the attachment of a lead-type resistor only to the terminals of a relay to be connected to a circuit requiring a resistor, therefore allowing the relay to be to smaller external dimension which in turn allows the electrical connector box to be reduced in size. If the relays within the electrical connector box are reduced in size along the vertical axis, the electrical connector box can be made thinner (reduced height). A thinner electrical connector box allows sufficient space between the surface of the instrument panel and the electrical connector box into which the instrument panel can bend in order to reduce the shock of collision in the event that a quick stop results in the passenger striking the instrument panel.

It is preferable that the two leads be welded to respective relay terminals before the relay terminals are welded to the bus bars. Because the resistor can be connected by wiring its leads to the relay terminals before assembly of the electrical connector box, only the relay terminals need be welded to the internal circuit bus bar during assembly of the connector box, thus increasing the efficiency with which the electrical connector box can be assembled. In addition, cost is reduced because the relay terminals and resistor leads need not be connected through a separate component.

Moreover, it is preferable that the welded connection between the two leads and relay terminals be at the same locations as the welded connections between the relay terminals and bus bar. More specifically, it is preferable that both leads be welded to the bus bar after which the relay terminals be placed over the welded leads and welded to the bus bar. A space-saving structure thus becomes possible because a separate region for the connection of the resistor leads is not required due to the insulator board-attached bus bar, resistor leads, and relay terminals being welded together at a single location. Further, the bus bar may be welded to the same location where the resistor lead is welded to the relay terminal, or the relay terminal, resistor lead, and bus bar may be welded together as a single assembly.

The relay terminals may be welded to a common-use bus bar and both leads welded or frictionally connected to the common-use bus bar after which the entire assembly is connected to the bus bar. This construction allows the shape of the bus bar, to which the relay terminal and resistor lead are attached, to be freely determined, thus making it possible to freely establish the location of the connection between the terminals and leads, and the location of the connection between the bus bar and internal circuit bus bar as means of more effectively utilizing the limited space within the case of the electrical connector box.

As previously noted, the relay does not include a resistor circuit, but that a resistor be attached to the relay terminals only if the circuit to which the relay is to be connected requires the use of a resistor. Therefore, the relay can be made smaller and at reduced cost compared to a relay which contains a resistor circuit.

This structure allows the use of relays that do not contain an internal resistor circuit, but provides for the attachment of a lead-type resistor only to the terminals of a relay to be connected to a circuit requiring a resistor, therefore allowing the relay to be to smaller external dimension which in turn allows the electrical connector box to be reduced in size.

An aspect of the present invention provides a relay provided in an electrical circuit; the relay including a plurality of terminals projecting from the body of the relay; the relay configured to allow connection of leads of a lead-type resistor to the terminals projecting from the body of the relay when the relay is to be connected to a circuit requiring a resistor. Further, the relay is positioned within an electrical connector box and connected to an internal circuit therein. The relay may be positioned within an electrical connector box and connected to an internal circuit therein through attachment to a relay receptacle provided on the exterior of the electrical connector box. Further, the relay is a vehicular use relay and the electrical circuit is an automotive electrical circuit; and the relay is free of an internal resistor circuit parallel wired to a coil therein.

A further aspect of the present invention provides an electrical connector box including a plurality of relays; a bus bar fixedly mounted on an insulator board within a case positioned between upper and lower cases; bend formed terminals that project from the body of the relay welded to the bus bar; each of the relays configured to allow connection of leads of a lead-type resistor to terminals projecting from the body of the relay when the relay is to be connected to a circuit requiring a resistor. Further, the leads of the lead-type resistor may be directly connected to the terminals of the relay when the relay is to be connected to a circuit requiring a resistor. The leads of the lead-type resistor may be connected through the bus bar to the terminals of the relay when the relay is to be connected to a circuit requiring a resistor. The relay is free of an internal resistor circuit parallel wired to a coil therein.

In a further aspect of the present invention, the leads of the lead-type resistor are welded to respective relay terminals before the relay terminals are welded to the bus bar. The welded connection between the leads and respective relay terminals may be positioned at the same locations as the welded connections between the relay terminals and the bus bar. The leads of the lead-type resistor are welded to the bus bar before the relay terminals are positioned over the welded leads and welded to the bus bar. Further, the relay terminals are welded to common-use bus bars and the leads of the lead-type resistor are welded to the common-use bus bars forming an assembly, before the assembly is connected to the bus bar. Additionally, the relay terminals are welded to common-use bus bars and the leads of the lead-type resistor are frictionally connected to the common-use bus bars forming an assembly, before the assembly is connected to the bus bar.

A further aspect of the present invention provides a method of forming an electrical connector box including providing a plurality of relays, a bus bar fixedly mounted on an insulator board within a case positioned between upper and lower cases, and bend formed terminals that project from the body of the relay welded to the bus bar; and connecting leads of a lead-type resistor to terminals projecting from the body of the relay when the relay is to be connected to a circuit requiring a resistor. Further, the method may include one of directly connecting the leads of the lead-type resistor to the terminals of the relay when the relay is to be connected to a circuit requiring a resistor, and connecting through the bus bar the leads of the lead-type resistor to the terminals of the relay when the relay is to be connected to a circuit requiring a resistor. The method further includes welding the leads of the lead-type resistor to respective relay terminals before welding the relay terminals to the bus bar. Further, the welded connection between the leads and respective relay terminals are positioned at the same locations as the welded connections between the relay terminals and the bus bar. In a further aspect of the present invention, the method includes welding the leads of the lead-type resistor to the bus bar before positioning the relay terminals over the welded leads and welding the relay terminals to the bus bar. Further, the method may include welding the relay terminals to common-use bus bars, and welding or frictionally connecting the leads of the lead-type resistor to the common-use bus bars forming an assembly; and subsequently connecting the assembly to the bus bar.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE INVENTION

Figure 1:
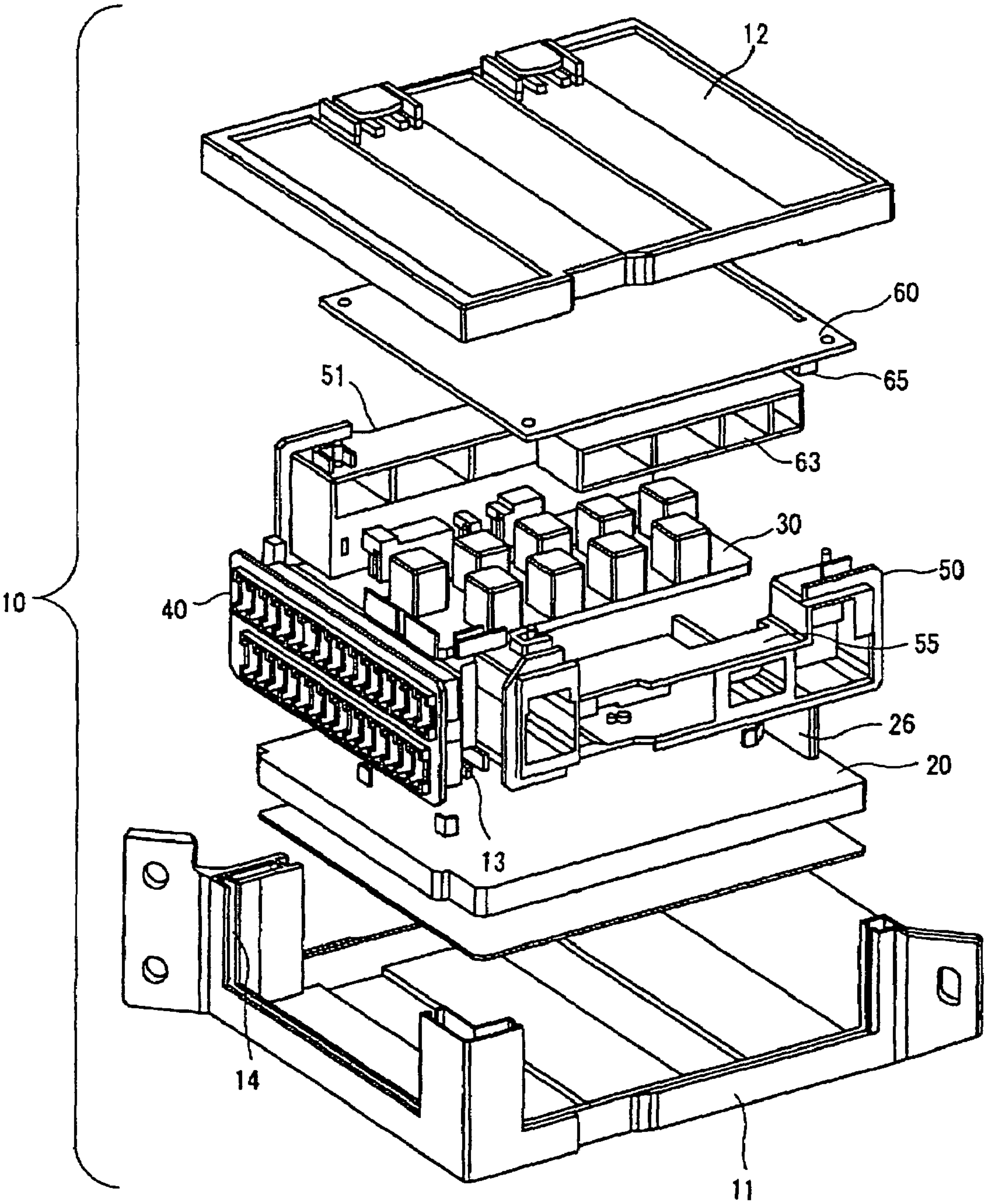
FIG. 1 is a perspective view of an electrical connector box according to a first embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The following will describe an embodiment of the invention with reference to the drawings. FIGS. 1 through 8 show a first embodiment of the present invention including an electrical connector box 10 in which internal circuit block 20 is located above lower case 11, relay module 30 is located above internal circuit block 20 at the central region of the case, fuse module 40 and connector modules 50 and 51 are externally located around the perimeter of relay module 30, ECU (electronic control unit) 60 is located above relay module 30, and upper case 12 is located over the entire structure.

Figure 2:
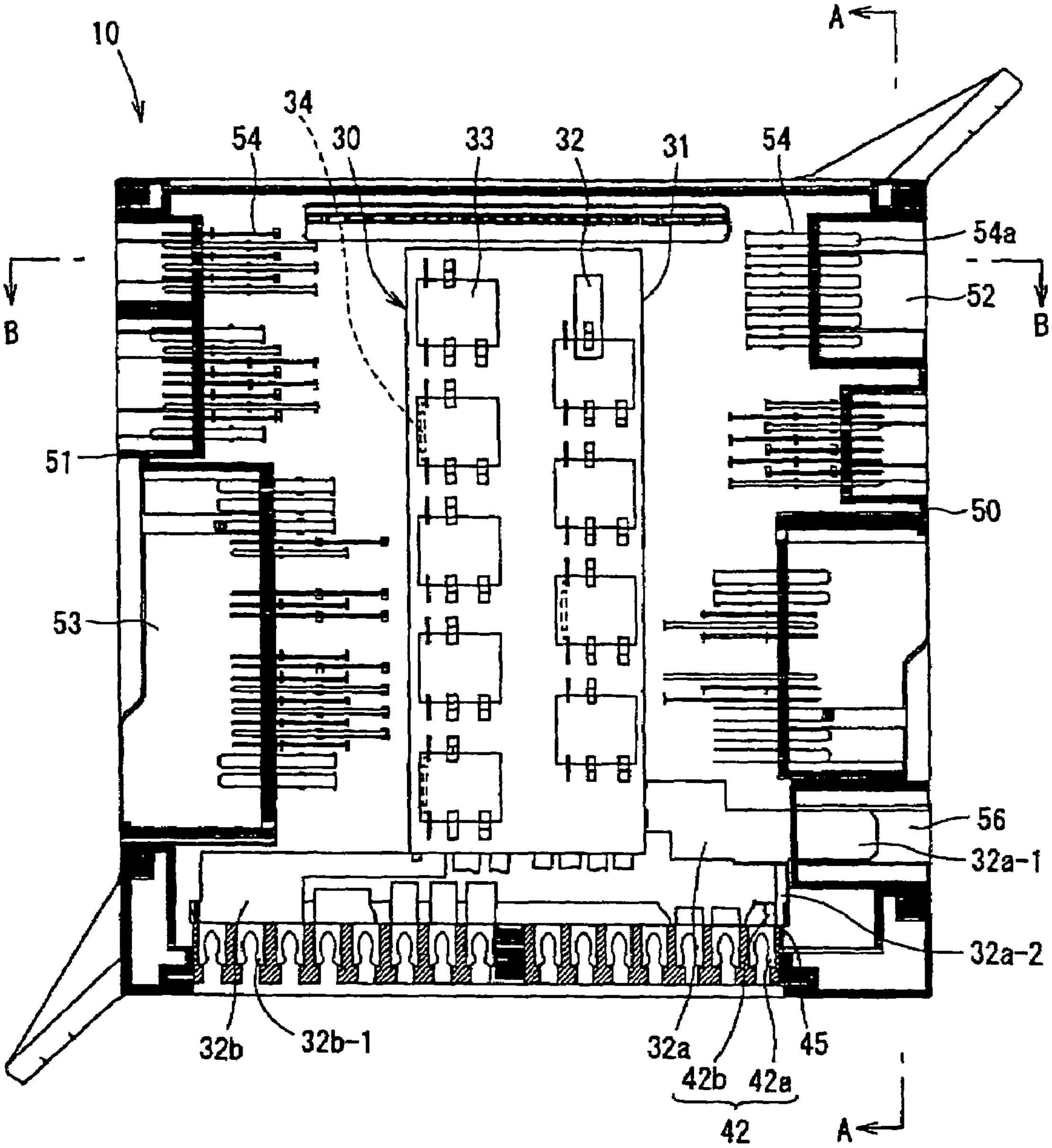
FIG. 2 is a cross sectional view taken in the horizontal direction of the internal circuit block of the embodiment of FIG. 1.

Relay module 30 is located above internal circuit 20 in the central region of the case, and bus bar 32, which is press blanked to the required shape from electrically conductive sheet metal, is located on top of insulator board 31. As shown in FIG. 2, common relay 33 is fixedly attached to insulator board 31 by welding terminals 33*b* and 33*c* of common relay 33 to bus bar 32.

Figure 3A:
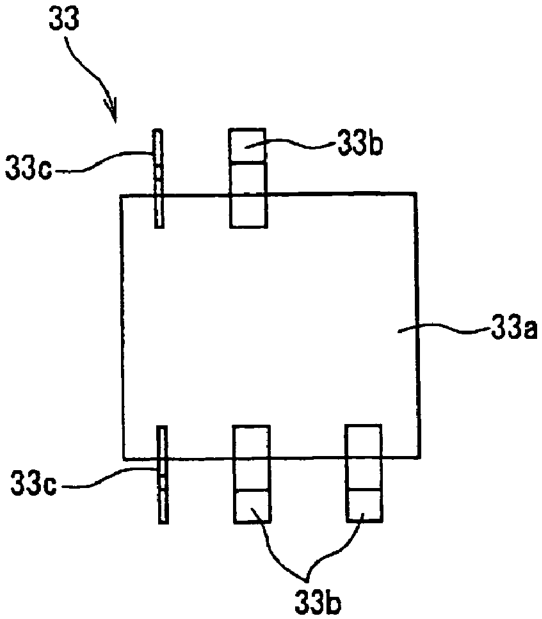
FIG. 3A is a plan view of the common relay of the electrical connector box of the embodiment of FIG. 1.
Figure 3B:
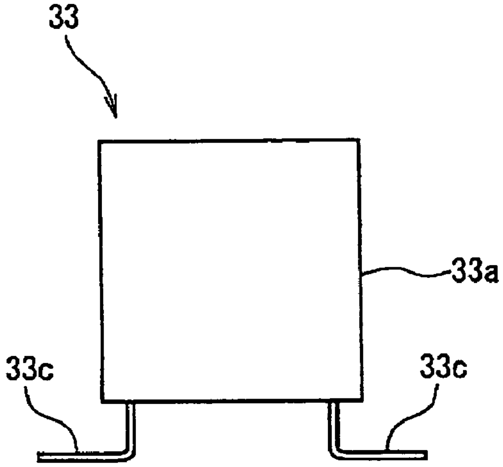
FIG. 3B is a left side view of the common relay of the electrical connector box of the embodiment of FIG. 1.
Figure 3C:
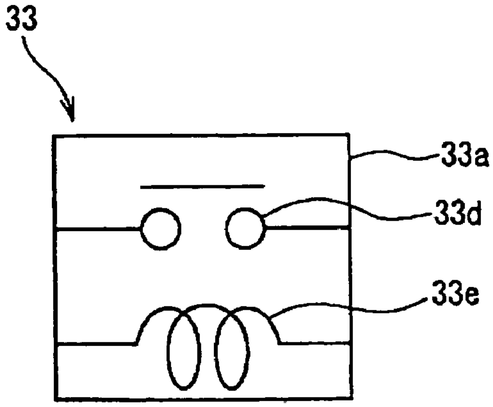
FIG. 3C is an internal circuit schematic of the common relay of the electrical connector box of the embodiment of FIG. 1.

As shown in FIGS. 3A–3B, terminals 33*b* and 33*c* project from relay body 33*a*, terminals 33*b* being connected to the power circuit and terminals 33*c* being connected to the control circuit. Within common relay 33, as shown in FIG. 3C, are contact points 33*d* that connect to terminals 33*b*, and relay coil 33*e* that connects to terminals 33*c*. There is no resistor circuit 33*g* wired in parallel to coil circuit 33*f* which connects to relay coil 33*e*.

Figure 4A:
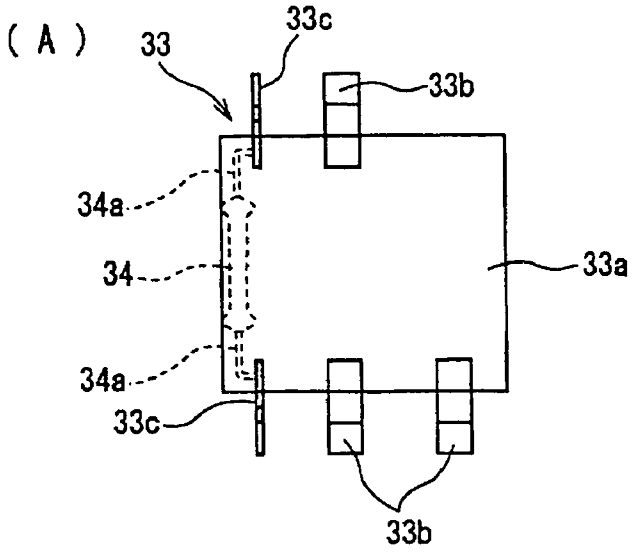
FIG. 4A is a plan view of the common relay with resistor attached of the electrical connector box of the embodiment of FIG. 1.
Figure 4B:
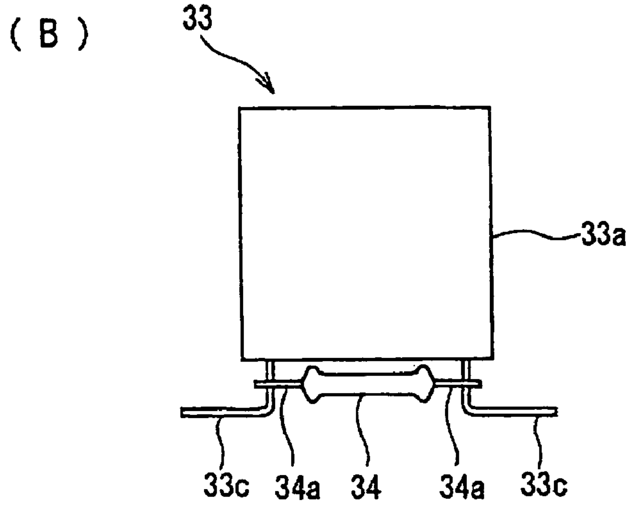
FIG. 4B is a left side view of the common relay with resistor attached of the electrical connector box of the embodiment of FIG. 1.
Figure 4C:
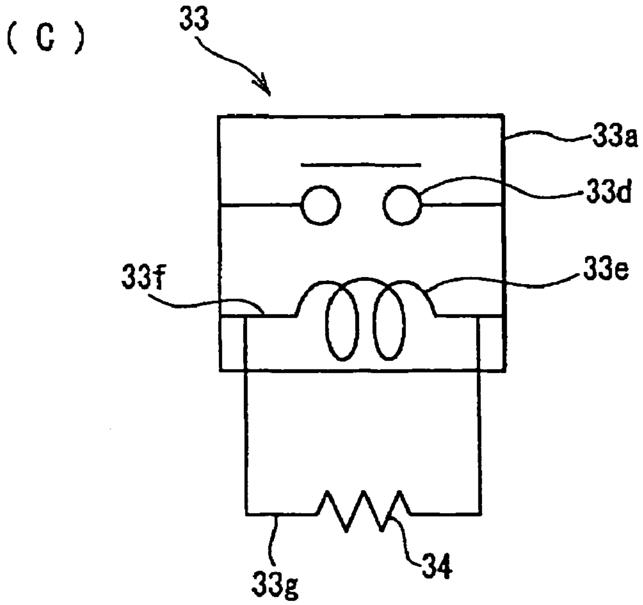
FIG. 4C is an internal circuit schematic of the common relay with resistor attached of the electrical connector box of the embodiment of FIG. 1.

If common relay 33 is to be used in a circuit that does not require the inclusion of a resistor, terminals 33*c*, which project from common relay 33, are welded to bus bar 32 on the top of insulator board 31 without attaching resistor 34 to common relay 33. Conversely, as shown in FIGS. 4A–4C, when common relay 33 is to be used in a circuit that requires the inclusion of a resistor circuit, lead-type resistor 34 is provided in common relay 33. That is, before common relay 33 is welded to bus bar 32, the lead on each side of resistor 34 is welded to the side of the respective terminals 33*c* that extends beneath relay body 33*a*, thus locating resistor 34 below relay body 33*a*. As FIG. 4C illustrates, this structure integrates resistor circuit 33*g* into coil circuit 33*f*, which is positioned within relay body 33*a*, through a parallel-wired connection.

Figure 7:
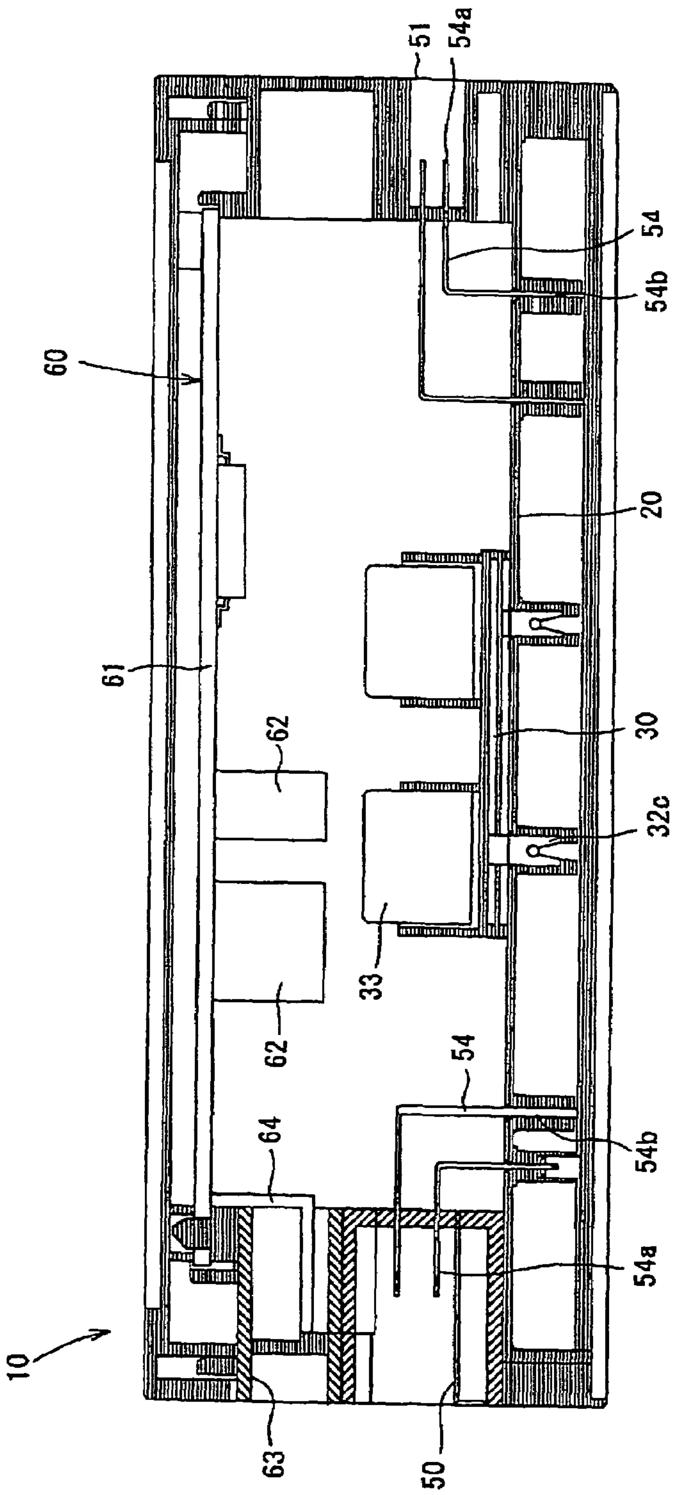
FIG. 7 is a cross sectional view taken along line B—B in FIG. 2 of the electrical connector box of the embodiment of FIG. 1.

Electrical power is supplied to relay module 30 through input bus bar 32*a* as shown in FIG. 2. End 32*a*-1 of input bus bar 32*a* extends into connector receptacle 56, which serves as the electrical power input part of connector module 50, and makes connection to the terminal within the power connector. Conversely, on the output side of relay module 30, output bus bar 32*b* connects to fuse 44 in fuse module 40, or output bus bar 32*c*, as illustrated in FIG. 7, makes frictional connection to wires w which extend beneath insulator board 31 and serve as the conductors of internal circuit block 20.

Figure 5:
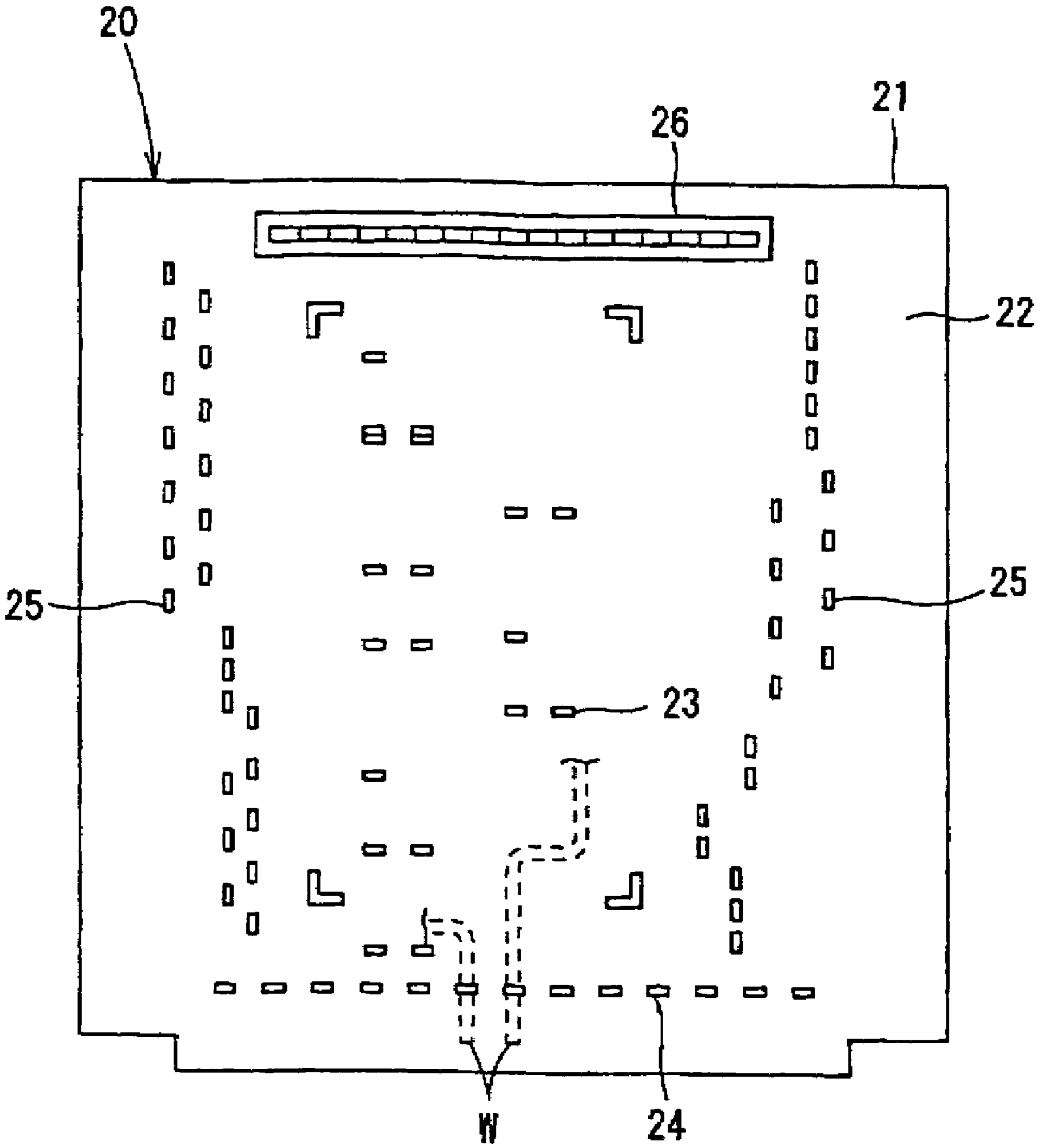
FIG. 5 is a plan view of the internal circuit block of the embodiment of FIG. 1.

Wires w, which serve as the conductors of internal circuit block 20, are arranged within case 21. Relay module 30, fuse module 40, and connector modules 50 and 51 are located on top of top panel 22 of case 21, and as shown in FIG. 5, bus bars 32 of relay module 30 pass through terminal slots 23, terminal connectors 43 of fuse module 40 pass through terminal slots 24, and terminal connectors 53 of connector modules 50 and 51 pass through terminal slots 25. Moreover, connector 26, within which are located terminals connected to wires w, extends from the perimeter of the front side of the case (shown in the upper portion of FIG. 5).

Fuse module 40 is located at the front lateral side of electrical connector box 10 (lower region of FIG. 2) with fuse receptacle 41 located on one side and externally exposed between lower case 11 and upper case 12. Bus bar 42 is connected to the input terminals of fuses 44 within fuse receptacles 41. One end of bus bar 42 is formed as friction tab 42*a* that makes frictional connection with the fuse 44 terminal, and the other end 42*b* extends toward connector module 50 on the right side of electrical connector box 10. Connecting part 42*b* is resistance welded to connector part 32*a*-2, which branches off from relay module 30, to form welded joint 45. Therefore, attaching an electrical power connector to receptacle 56, which is the power input part of connector module 50, results in the supply of electrical power to both relay module 30 and fuse module 40. In addition, the input terminals for fuses 44 that do not connect to bus bar 42 connect to output bus bar 32*b* which extends from relay module 30.

Figure 6:
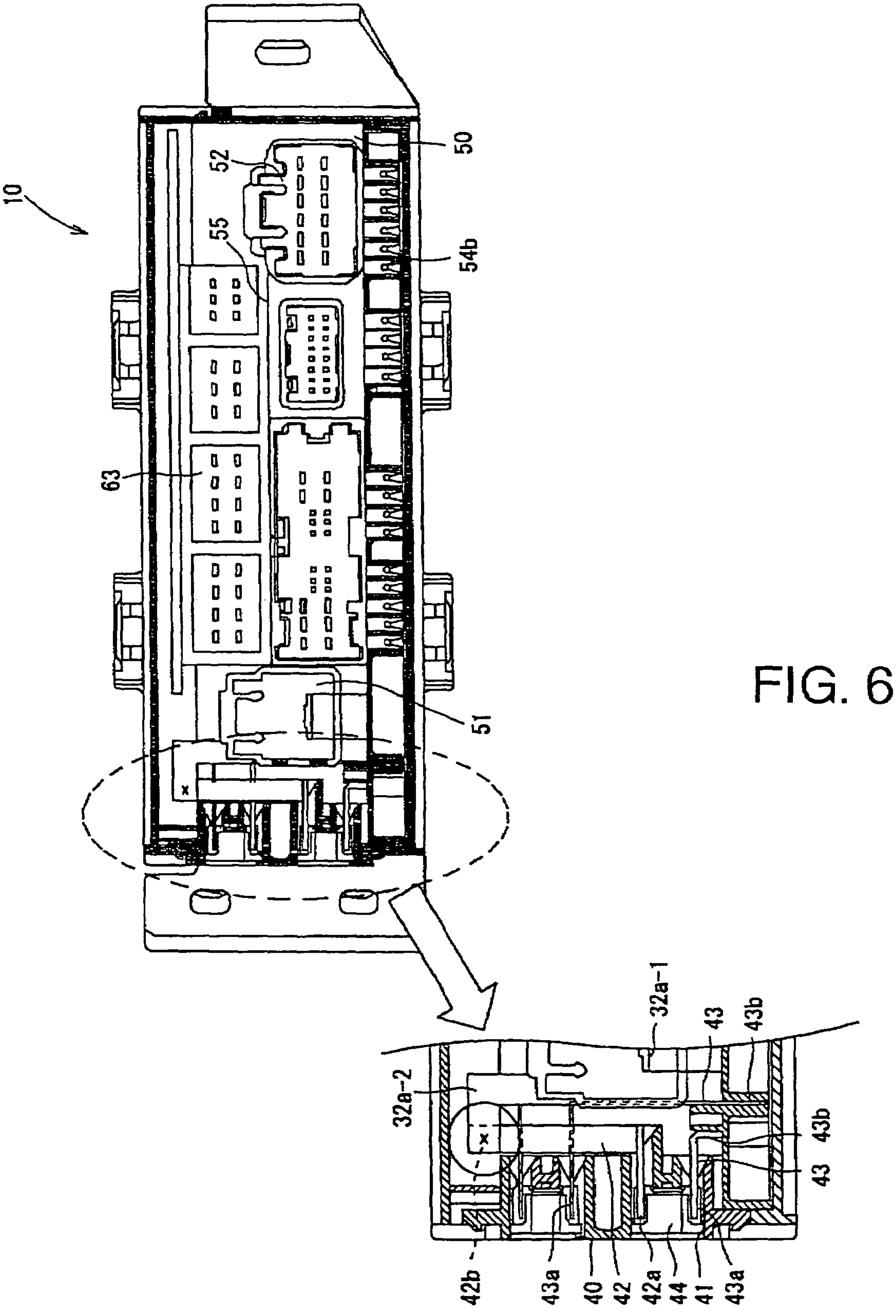
FIG. 6 is a cross sectional view taken along line A—A in FIG. 2 of the electrical connector box of the embodiment of FIG. 1.

As shown in FIG. 6, L-shaped connector terminals 43, each having both ends formed as friction connecting parts, connect to the output terminals of fuse 44. One friction connector end 43*a* makes friction connection to the output terminal of fuse 44, and the other friction connector end 43*b* makes friction connection to wires w of internal circuit block 20.

Connector modules 50 and 5 1, which are located on the right and left sides of electrical connector box 10, include connector receptacles 52, 53, and 56 which are externally exposed at the sides of the connector box between lower case 11 and upper case 12. Moreover, ECU connector 63 of ECU 60 joins to cutout portion 55 which is formed into the top portion of connector module 50.

Connectors 54, which are joined to the terminals within the connector inserted into connector receptacles 52 and 53, are all formed in an "L" shape. One end of each connector is formed as male tab 54*a* that extends into connector receptacle 52 and 53 for connection to the terminal in the mating connector, and the other end is formed as friction connector 54*b* that makes friction connection to wires 'w' of the internal circuit.

Figure 8:
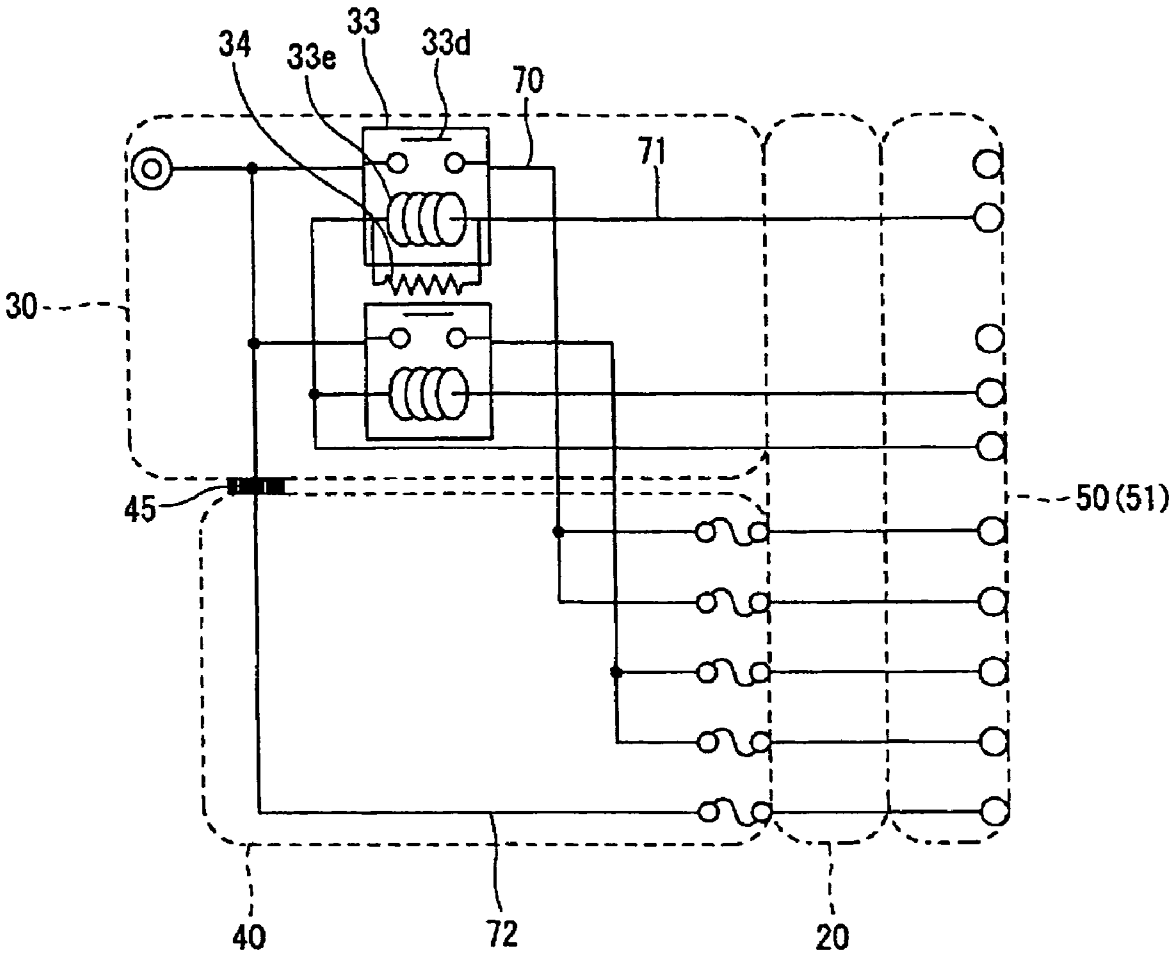
FIG. 8 is a circuit schematic of the relay module, fuse module, internal circuit block, and connector modules of the electrical connection box of the embodiment of FIG. 1.

FIG. 8 is a circuit schematic of internal circuit block 20 of relay module 30, fuse module 40, and connector modules 50 and 51. Power circuit 70, which supplies power to the load side, forms a connection between the power input part and connector modules 50 and 51 through relay module 30, fuse module 40, and internal circuit block 20. Control circuit 71, which is connected to relay coil 33*e*, provides a control function for power circuit 70 and connects the power input part to connector modules 50 and 51 through relay module 30 and internal circuit block 20. Also, additional circuit 72 is connected to the power input part through welded joint 45 without going through common relay 33 of relay module 30, and thus makes connection to connector modules 50 and 51 directly through fuse module 40 and internal circuit block 20.

As shown in FIG. 7, multiple electronic components 62 are soldered to conductors (not shown in the drawings) on the lower side of ECU baseboard 61. ECU 60 female connector 65 projects horizontally from the lower edge of ECU baseboard 61 at the rear side of electrical connector box 10, and joins to male connector 26, thereby joining respective terminals within each connector in order to connect wires w of the internal circuit to the conductors of ECU 60, and thus supply electrical power to ECU 60. Moreover, ECU connector 63 projects from the edge of ECU baseboard 60 and connects to cutout portion 55 of connector module 50. One end of contact terminals 64 connects to the conductors of ECU 60, and the other end extends into ECU connector 63 for connection to terminals of the connector to be inserted to ECU connector 63.

Frame supports including channels 14 extend from the four corners of the floor plate of approximately square-shaped lower case 11, and lower case 11 joins to approximately square-shaped upper case 12 through the frame supports. Fuse module 40 is located on the forward facing side of the assembly between lower case 11 and upper case 12, and connector modules 50 and 51 are located on the right and left sides respectively at 90-degree angles to the orientation of fuse module 40.

The following will describe the procedure through which electrical connector box 10 is assembled. Internal circuit block 20 is initially installed into lower case 11 from the top. Next, terminal end 32*a*-1 of input bus bar 32*a* of relay module 30 (relay module 30 including insulator board 34 on which multiple common relays 33 with and without resistor 34 are mounted) is placed into connector receptacle 56 of connector module 50, friction tabs 32*b*-1 of output bus bar 32*b* are placed into fuse receptacle 41 of fuse module 40, and connector part 32*a*-2 of input bus bar 32*a* and connector part 42*b* of fuse module 40 bus bar 42 in fuse module 40, which mutually overlap, are joined through resistance welding. Relay module 30, fuse module 40, and connector modules 50 and 51 are then placed onto internal circuit block 20 as a single assembly. At this time, the connector terminal of each module and bus bar friction tabs are inserted through the terminal slots in case 21 of internal circuit block 20, and frictionally connected to wires w. The ECU is then placed on top of the modules, and female connector 65 is joined to male connector 26 of internal circuit block 20 to make connection between wires w of the internal circuit and the ECU 60 conductors. Lastly, upper case 12 is placed over the assembly and connected to lower case 1 through the frame supports.

The above-noted structure does not require that common relay 33 contain resistor 34, and because lead-type resistor 34 need only be attached to terminals 33*c* of a common relay 33 to be connected to a circuit that requires a resistor, common relay 33 can be made smaller and at reduced cost compared to a relay which contains a resistor circuit. Further, the size of electrical connector box 10 can be reduced due to the decreased external dimensions of common relay 33.

Because relay module 30 is located at a central region within the case, and fuse module 40 and connector modules 50 and 51 at externally exposed locations around the perimeter of relay module 30, receptacles for the relays, fuses, and connectors need not be attached to the top of upper case 12 nor to the bottom of lower case 11, thus making it possible to eliminate electrical components that project from the top and bottom of the case and therefore reducing the height dimension of electrical connector box 10.

Particularly in applications where electrical connector box 10 is located within the instrument panel in front of the passenger seat, an electrical connector box formed to thinner cross section (reduced height dimension) provides more space between the instrument panel and connector box 10, therefore allowing the instrument panel to sufficiently bend inward in order to reduce the shock of collision should a quick stop or like occurrence result in the passenger striking the instrument panel.

While this embodiment mounts the relays to a relay module within the electrical connector box, the relay receptacle may also be located on an external side of the case for the insertion of relays equipped or not equipped with an internal resistor.

Figure 9A:
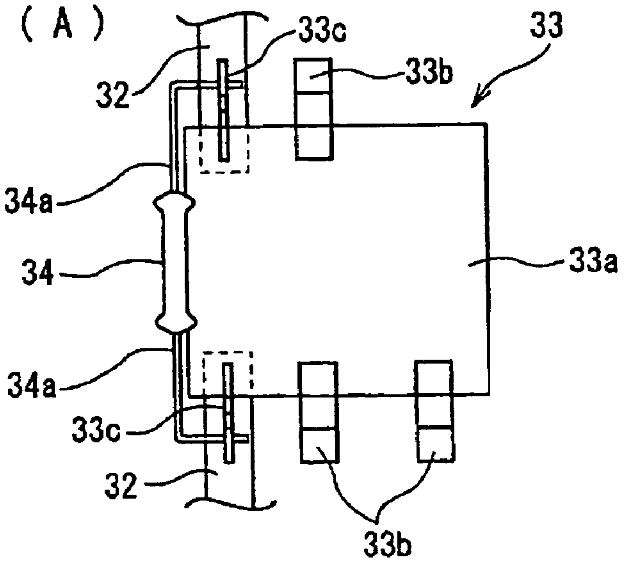
FIG. 9A is a plan view of a modified version of the relay of the embodiment of FIG. 1.
Figure 9B:
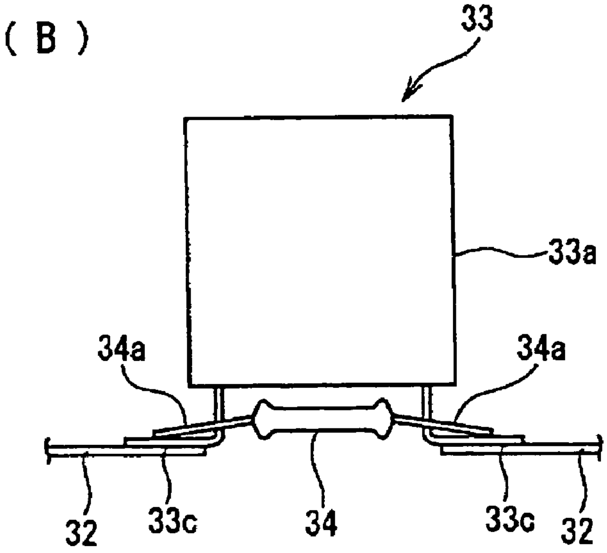
FIG. 9B is a left side view of a modified version of the relay of the embodiment of FIG. 1.

FIGS. 9A and 9B describe a modified version of the first embodiment wherein bent parts of the two leads 34*a* of resistor 34 are welded to the upper sides of terminals 33*c* that project from relay body 33*a*. With leads 34*a* of resistor 34 welded to terminals 33*c*, the lower sides of terminals 33*c* of common relay 33 are then welded to bus bar 32, thereby forming a common location where leads 34*a* of resistor 34, terminals 33*c* of common relay 33, and bus bar 32 are welded together.

Figure 10A:
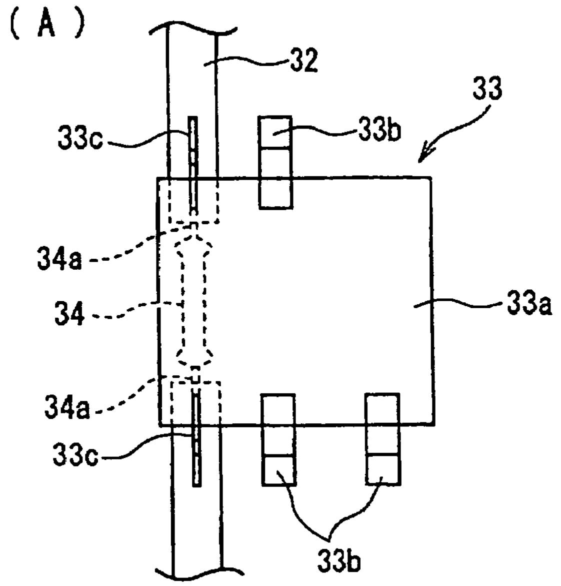
FIG. 10A is a plan view of a relay according to a second embodiment of the present invention.
Figure 10B:
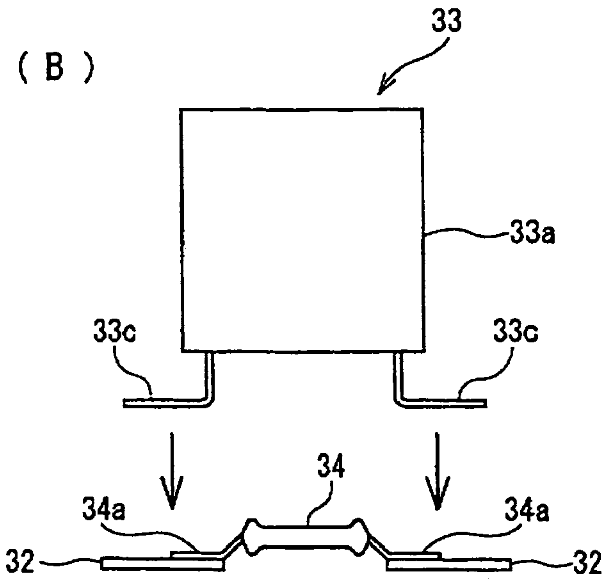
FIG. 10B is a left side view of the relay according to the embodiment of FIG. 10A.

FIGS. 10A and 10B describe a second embodiment of the present invention wherein leads 34*a* of resistor 34 are welded to bus bar 32 which is fixedly attached to insulator board 31 of relay module 30, after which terminals 33*c* of common relay 33 are welded to the location where leads 34*a* have been welded to bus bar 32. This construction eliminates the need to provide a separate space for the connection of leads 34*a* of resistor 34, and results in a more compact design.

Figure 11A:
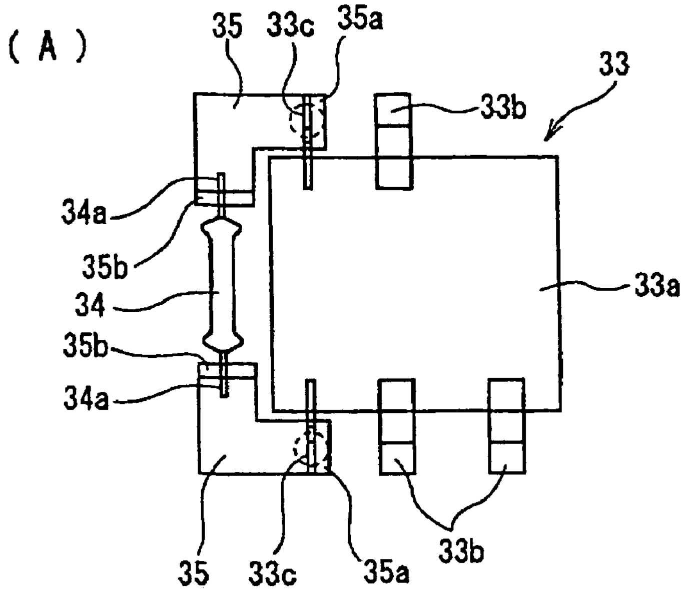
FIG. 11A is a plan view of a relay according to a third embodiment of the present invention.
Figure 11B:
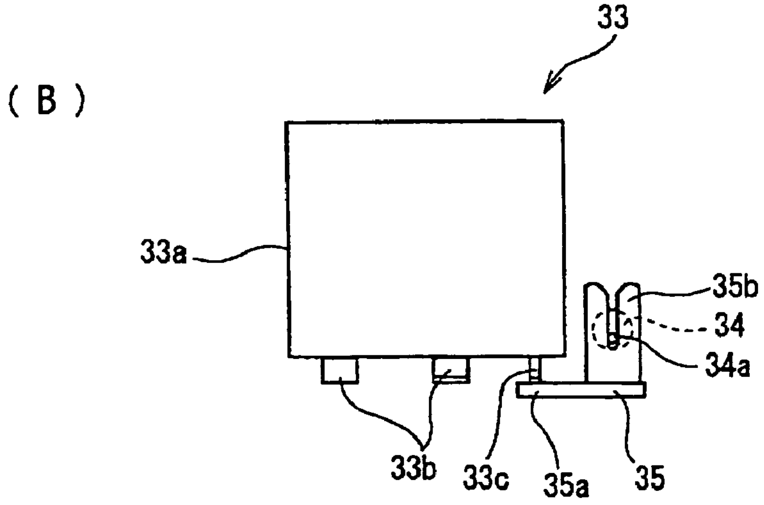
FIG. 11B is a left side view of the relay according to the embodiment of FIG. 11A.
Figure 12:
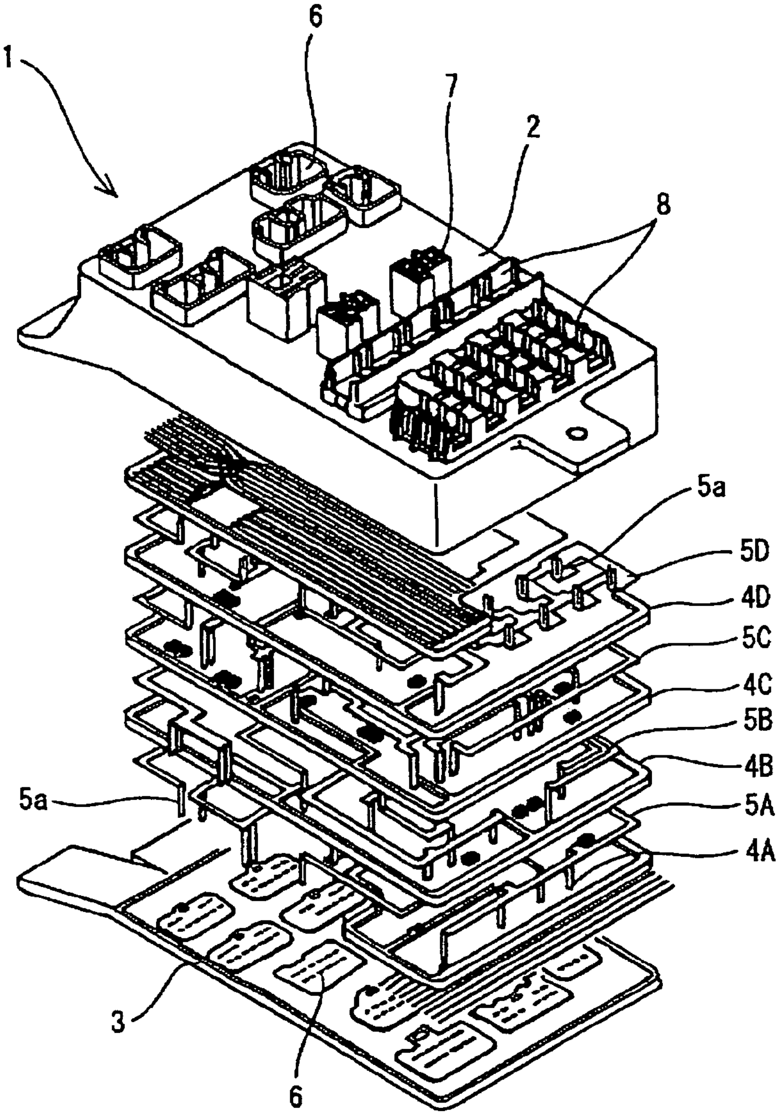
FIG. 12 PRIOR ART
FIG. 12 is an electrical connector box of the prior art.
Figure 13:
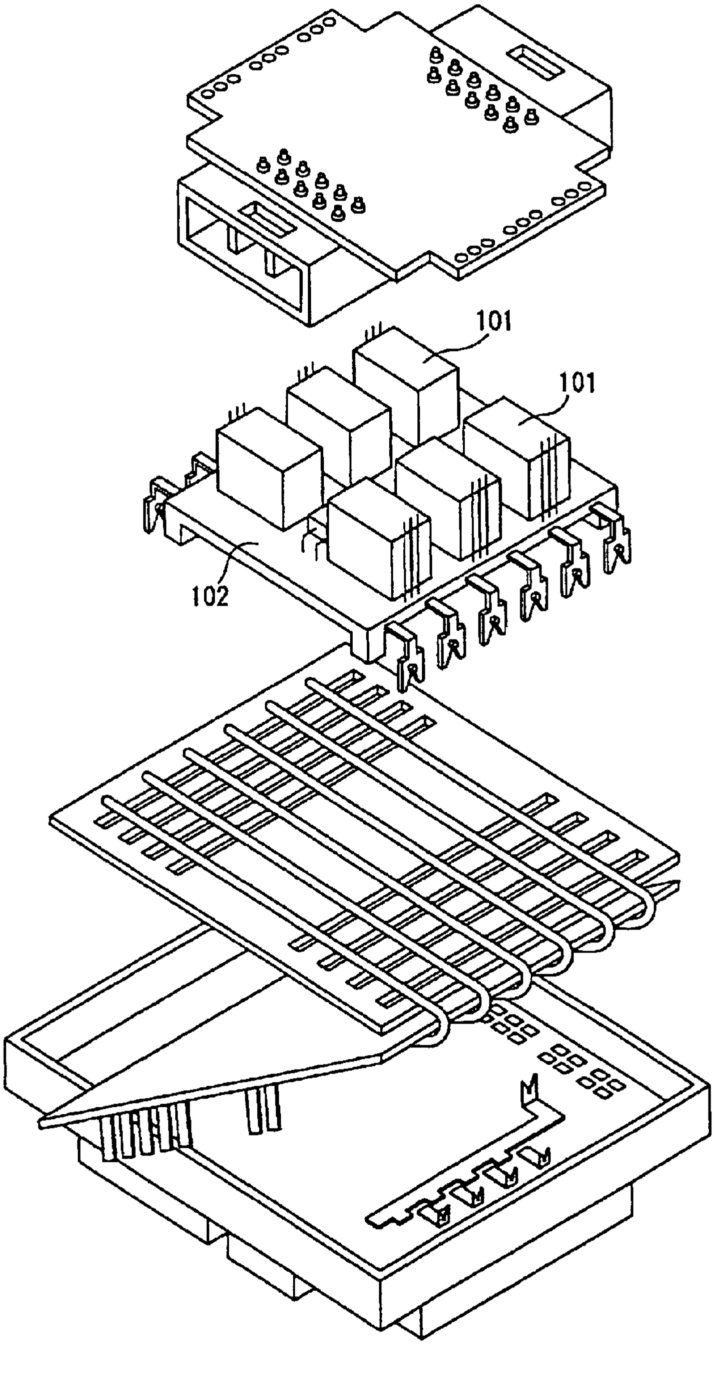
FIG. 13 PRIOR ART
FIG. 13 is an electrical connector box of the prior art.
Figure 14:
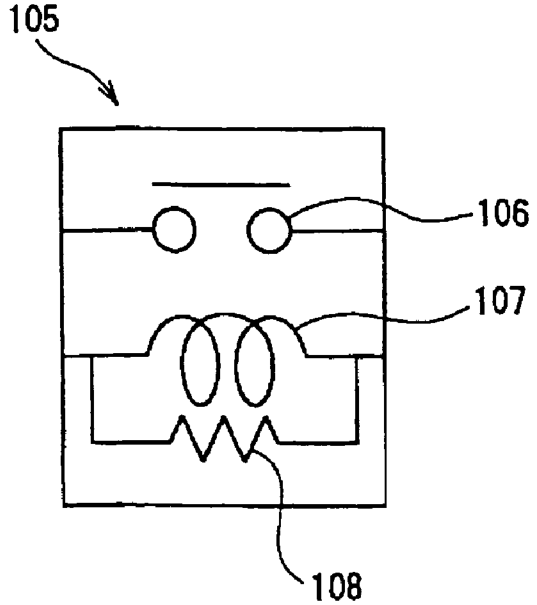
FIG. 14 PRIOR ART
FIG. 14 is a circuit schematic of a relay of the prior art.

FIGS. 11A and 11B describe a third embodiment of the present invention wherein terminals 33*c* of common relay 33 and leads 34*a* of resistor 34 are connected through L-shaped common-use bus bars 35. Terminals 33*c* of common relay 33 are welded to end 35*a* of bus bar 35, and friction connector 35*b*, which is formed on the other end of bus bar 35, is frictionally connected to leads 34*a* of resistor 34. As described above, terminals 33*c* of common relay 33 and leads 34*a* of resistor 34 are connected through L-shaped common-use bus bars 35, after which L-shaped common-use bus bars 35 are welded to bus bar 32 which is fixedly attached to insulator board 31 of relay module 30.

Due to the above described structure allowing the connection of leads 34*a* of resistor 34 to terminals 33*c* of common relay 33 through common-use bus bar 35 before the assembly of electrical connector box 10, only terminals 33*c* of common relay 33 need be welded to bus bar 32 of the internal circuit, thus making the assembly of electrical connector 10 more efficient. Further, because common-use bus bar 35, to which terminals 33*c* of common relay 33 and leads 34*a* of resistor 34 are connected, may be fabricated to any desired shape, the connecting location between terminals 33*c* and leads 34*a*, and the connecting location between common-use bus bar 35 and bus bar 32 of the internal circuit, may be freely established. Moreover, lead terminals 34*a* of resistor 34 may also be welded to L-shaped common bus bar 35.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. A relay provided in an electrical circuit; said relay comprising:

a plurality of terminals projecting from a body of said relay;

said relay configured to allow connection of leads of a resistor to said terminals projecting from the body of said relay; and leads of a resistor connected to said terminals where the terminals project outwardly from the body of said relay.

2. The relay according to claim 1, wherein said relay is positioned within an electrical connector box and connected to an internal circuit therein.

3. The relay according to claim 1, wherein said relay is positioned within an electrical connector box and connected to an internal circuit therein through attachment to a relay receptacle provided on the exterior of the electrical connector box.

4. The relay according to claim 1, wherein said relay is a vehicular use relay and the electrical circuit is an automotive electrical circuit.

5. The relay according to claim 1, wherein said relay is free of an internal resistor circuit parallel wired to a coil therein.

6. An electrical connector box comprising:

a plurality of relays;

a bus bar fixedly mounted on an insulator board within a case positioned between upper and lower cases;

bend formed terminals that project from a body of said relay welded to said bus bar;

each of said relays configured to allow connection of leads of a resistor to terminals projecting from the body of said relay; and leads of a resistor connected to said bend formed terminals where the terminals project outwardly from the body of said relay.

7. The electrical connector box according to claim 6, wherein said leads of the resistor are directly connected to said terminals of said relay.

8. The electrical connector box according to claim 6, wherein said leads of the resistor are connected through said bus bar to said terminals of said relay.

9. The electrical connector box according to claim 6, wherein each said relay is free of an internal resistor circuit parallel wired to a coil therein.

10. The electrical connector box according to claim 6 wherein said leads of said resistor are welded to respective relay terminals before the relay terminals are welded to said bus bar.

11. The electrical connector box according to claim 10 wherein the welded connection between said leads and respective relay terminals are positioned at the same locations as the welded connections between the relay terminals and said bus bar.

12. The electrical connector box according to claim 6, wherein said leads of said resistor are welded to said bus bar before said relay terminals are positioned over the welded leads and welded to said bus bar.

13. The electrical connector box according to claim 6 wherein said relay terminals are welded to common-use bus bars and said leads of said resistor are welded to said common-use bus bars forming an assembly, before said assembly is connected to said bus bar fixedly mounted on an insulator board.

14. The electrical connector box according to claim 6 wherein said relay terminals are welded to common-use bus bars and said leads of said resistor are frictionally connected to said common-use bus bars forming an assembly, before said assembly is connected to said bus bar fixedly mounted on an insulator board.

15. A method of forming an electrical connector box comprising:

providing a plurality of relays, a bus bar fixedly mounted on an insulator board within a case positioned between upper and lower cases, and bend formed terminals that project from the a body of said relay welded to said bus bar; and connecting leads of a resistor to terminals where the terminals project outwardly from the body of said relay.

16. The method of forming an electrical connector box according to claim 15, further comprising:

one of directly connecting said leads of the resistor to said terminals of said relay, and connecting through said bus bar said leads of the resistor to said terminals of said relay.

17. The method of forming an electrical connector box according to claim 15, further comprising:

welding said leads of said resistor to respective relay terminals before welding the relay terminals to said bus bar.

18. The method of forming an electrical connector box according to claim 17 wherein the welded connection between said leads and respective relay terminals are positioned at the same locations as the welded connections between the relay terminals and said bus bar.

19. The method of forming an electrical connector box according to claim 15 further comprising:

welding said leads of said resistor to said bus bar before positioning said relay terminals over the welded leads and welding said relay terminals to said bus bar.

20. The method of forming an electrical connector box according to claim 15 further comprising:

welding said relay terminals to common-use bus bars, and welding or frictionally connecting said leads of said resistor to said common-use bus bars forming an assembly; and subsequently connecting said assembly to said bus bar fixedly mounted on an insulator board.

21. A relay provided in an electrical circuit; said relay comprising:

a plurality of terminals projecting from a body of said relay;

said relay configured to allow connection of leads of a resistor to said terminals projecting outwardly from the body of said relay when said relay is to be connected to a circuit requiring a resistor;

wherein said relay is free of an internal resistor circuit parallel wired to a coil therein.

22. An electrical connector box comprising:

a plurality of relays;

a bus bar fixedly mounted on an insulator board within a case positioned between upper and lower cases;

bend formed terminals that project from the a body of said relay welded to said bus bar;

each of said relays configured to allow connection of leads of a resistor to terminals projecting outwardly from the body of said relay when said relay is to be connected to a circuit requiring a resistor;

wherein each said relay is free of an internal resistor circuit parallel wired to a coil therein.

* * * * *